(12) United States Patent
Wakisaka et al.

(10) Patent No.: US 6,831,673 B2
(45) Date of Patent: Dec. 14, 2004

(54) OPTICAL WRITE HEAD, AND METHOD OF ASSEMBLING THE SAME

(75) Inventors: Masahide Wakisaka, Osaka (JP); Takahisa Arima, Osaka (JP); Harunobu Yoshida, Osaka (JP); Yukihisa Kusuda, Osaka (JP); Seiji Oono, Osaka (JP); Yasunao Kuroda, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 30 days.

(21) Appl. No.: 09/825,889

(22) Filed: Apr. 5, 2001

(65) Prior Publication Data

US 2001/0040620 A1 Nov. 15, 2001

(30) Foreign Application Priority Data

| Apr. 6, 2000 | (JP) | ................................... P.2000-104786 |
| Jul. 13, 2000 | (JP) | ................................... P.2000-213005 |
| Jul. 13, 2000 | (JP) | ................................... P.2000-213006 |
| Oct. 11, 2000 | (JP) | ................................... P.2000-310815 |

(51) Int. Cl.$^7$ .............................. B41J 2/45; B41J 2/385
(52) U.S. Cl. ...................................... 347/238; 347/130
(58) Field of Search ................................ 347/130, 238, 347/241, 242, 256, 257, 246, 263; 200/314

(56) References Cited

U.S. PATENT DOCUMENTS

| 4,703,334 A | 10/1987 | Mochimaru et al. ........ 347/130 |
| 4,913,526 A | 4/1990 | Hediger ...................... 359/819 |
| 5,045,867 A | * 9/1991 | Fuse ........................... 347/256 |
| 5,177,405 A | 1/1993 | Kusuda et al. ............ 315/169.1 |
| 5,321,429 A | 6/1994 | Ono et al. ................... 347/238 |
| 5,506,612 A | 4/1996 | Ogata et al. ................ 347/138 |
| 5,607,048 A | * 3/1997 | Kaizu et al. ................ 200/314 |
| 6,025,863 A | 2/2000 | Nakajima et al. ........... 347/238 |

FOREIGN PATENT DOCUMENTS

| EP | 0 790 132 A2 | 8/1997 | |
| JP | 1-238962 | 9/1989 | |
| JP | 2-14584 | 1/1990 | |
| JP | 2-92650 | 4/1990 | |
| JP | 2-92651 | 4/1990 | |
| JP | 2-263668 | 10/1990 | |
| JP | 9-187981 | 7/1997 | |
| JP | 11-330560 | * 11/1999 | .............. B41J/2/44 |
| JP | 2000-103116 | * 4/2000 | .............. B41J/2/44 |
| WO | WO 90/02387 | 8/1990 | |

* cited by examiner

*Primary Examiner*—Hai Pham
(74) *Attorney, Agent, or Firm*—Whitham, Curtis & Christofferson, P.C.

(57) ABSTRACT

In an optical write head, a rod lens array, a substrate support member for supporting a substrate, and a driver circuit board are fixedly held by a support member. The support member and the substrate support member are formed from metallic material, and a frame of the rod lens array is formed from a glass plate. Further, distance between a light-emitting section of a light-emitting device array and a light-incident end face of the rod lens array is adjusted, by means of rotating eccentric pins. Further, light-emitting device array chips are die-bonded on the substrate bonded at predetermined positions on the substrate support member while the position of the substrate support member is taken as a reference plane.

31 Claims, 11 Drawing Sheets

OPTICAL WRITE HEAD, AND METHOD OF ASSEMBLING THE SAME

BACKGROUND OF THE INVENTION

The present invention relates to the structure of an optical write head using light-emitting device arrays to be provided in a high-resolution electrophotographic printer, and to a method of assembling the optical write head.

An optical write head to be used in an optical printer has hitherto been equipped with light-emitting device arrays, such as light-emitting diodes. The principle of an optical printer equipped with an optical write head is illustrated in FIG. 9. The surface of a cylindrical photosensitive drum 2 is coated with material (photosensitive material) possessing optical conductivity, such as amorphous Si or organic material. The photosensitive drum 2 rotates in accordance with a print speed. To begin with printing, the surface of photosensitive material provided over a rotating drum is charged uniformly with an electrostatic charger 4.

Next, an optical write head 6 radiates, onto the photosensitive material, light which assumes the image of a dot to be printed, thereby neutralizing the thus-exposed portion of the photosensitive material and forming a latent image. Subsequently, a development unit 8 causes toner to adhere to the photosensitive material in accordance with the charged status of the photosensitive material. A transfer unit 10 transfers toner onto paper 14 supplied from a cassette 12. A fixing unit 16 applies heat to the paper, thereby fixing the toner transferred on the paper. The paper is then fed to a stacker 18. After transfer of the latent image has been completed, the entirety of the electrically-charged photosensitive drum 2 is neutralized by an erasure lamp 20, and residual toner is removed by a cleaner unit 22.

The optical write head which has hitherto been employed is constructed such that a plurality of light-emitting device array chips are arranged in a single line or in a staggered layout on a substrate, in accordance with specifications pertaining to a print width and such that a rod-lens array or rod-lens arrays (e.g., product name: SELFOC Lens array manufactured by Nippon Sheet Glass Co. Ltd.) having gradient index rod lenses stacked thereon in the form of one or two lines is arranged opposite the light-emitting device array chips. FIG. 10 is a perspective view showing a rod lens array 11 having rod lenses stacked in two rows. A plurality gradient index rod lenses 24 are sandwiched between frames 26 and secured by means of resin 28.

FIG. 11 is a cross-sectional view showing a typical example of an optical write head constructed as described above. In this example, a plurality of light-emitting device array chips 30 are arranged in a single line on a printed circuit board 32 formed from glass epoxy, in accordance with specifications pertaining to a print width. A rod-lens array 24 having gradient index rod lenses stacked thereon in the form of one or two lines is arranged opposite the light-emitting device array chips 30. The light-emitting device array chips 30 and the rod lens arrays 34 are fixed on a housing 36 by means of a silicon filler 38.

(I) In association with an increase in print speed and an improvement in resolution, required precision of alignment of an optical system is increased significantly. A geometrical layout or related-art mechanical components fails to maintain the precision of the mechanical components, to thereby fail to satisfy performance requirements of the optical system.

Obtaining a high-resolution image requires setting within a range of ±30 µm respective specified values of the amount of deviation between the center of an optical axis and an illumination point of each or light-emitting devices, the distance from the illumination point to the end face of a rod lens array, and the distance from a photosensitive surface to the end face of the rod lens array.

(1) The lengths of rod lenses have a variation of about ±0.4 mm in manufacture. (2) There may be a case where the rod lens array has warpage toward an image surface or an object surface. (3) Fiber-reinforced plastics (FRP) from which a frame of the rod lens array is formed has a variation of about ±0.4 mm in thickness. Even if an optical component is positioned along the mechanical components, the precision of positioning exceeds a required range of optical precision, thereby failing to satisfying optical performance.

For this reason, there has arisen a necessity of three-dimensionally aligning the position of the rod lens array to a light-emitting device array. More specifically, (1) the distance between an illumination point and the surface of a photosensitive material must be matched with a conjugate length of the rod lens array; (2) the longitudinal center of a lens belonging to the rod lens array must be set to the center of the distance; and (3) deviation between the optical axis of the rod lens array, an illumination point, and the position of the surface of a photosensitive material must be adjusted with respect to the longitudinal direction of the rod lens array.

For this reason, a space is ensured beforehand between the housing of the optical write head and the rod lens array. The rod lens array is three-dimensionally aligned. The rod lens array is secured on the housing of the optical write head by means of filling the space with a silicon-based adhesive.

However, in order to align the optical axis of the rod lens array in the longitudinal direction thereof, the alignment must be performed through use of an actuator having high positional precision. An enormous amount on alignment time is required.

The mechanical components must be formed into complicated shapes, by means of ensuring, for example, a space for effecting alignment of an optical axis. Such complicated working of the mechanical components is a contributory factor to hindering a reduction in manufacturing costs of an optical write head.

In most cases, a head housing of the related-art optical write head is molded from engineering plastics. In a case where a rod lens array having the optical axis aligned is secured to the head housing, a silicon-based adhesive is usually used. Heat contraction (a contraction of about 8% arises in volume of the adhesive), which arises after the adhesive has been tilled and cured, or distortion of material of the head housing, which is caused by contraction of the head housing with time, poses difficulty in guaranteeing the positional precision of the optical axis over a period of years.

The present invention has been conceived to solve the drawbacks set forth and is aimed at providing an optical write head which obviates a necessity of alignment operation by use of a high-precision device and a necessity of complicated mechanical components, enables lower-cost manufacture of the optical write head, and is less susceptible to time-varying changes.

(II) In principle, in a primary scanning direction (i.e., the direction in which light-emitting points are to be scanned; that is, a direction perpendicular to a sheet of FIG. 11), the optical write head 6 having the light-emitting device array chips 30 arranged thereon must be made greater in size than a print width. In order to reduce the overall size of a printer using the optical write head 6, demand exists for reducing the size of the printer in a sub-scanning direction (i.e., a direction in which the photosensitive drum 2 rotates) As shown in FIG. 11, the printed circuit board 32 having the light-emitting array chips 30 mounted thereon must be arranged perpendicular to a light-emission optical axis 39. For this reason, a reduction in the width of the substrate 32 is effective for reducing the dimension of the printer in the sub-scanning direction.

A light-emitting diode (LED) array is commonly and widely used as a light-emitting array. Supply of a signal corresponding to an image signal output from a driver integrated circuit (IC) to LED chip arrays requires formation of bonding pads (BPs) equal in number to LED devices on the LED array chip 30. In the case of a resolution of 600 dpi, a pitch at which LED devices are to be arranged is 42.3 μm. Provided that a side of an area in which bonding pads (BP) are arranged is 80 μm, a pitch at which BPs are to be arranged is 80 μm or more. At least two rows of BPs must be arranged in the direction parallel to the direction in which LEDs are arranged.

In a case of manufacture of a print head of 600 dpi for A3-size paper, light-emitting points to be arranged in a one-dimensional layout assume a number of 7,000 or more. Wire bonds (WB) equal in number to the light-emitting points must be connected to a driver IC. Hence, driver IC chips 31 are die-bonded to the substrate on which the light-emitting array chips 30 are mounted. The driver IC chips 31 are connected to the light-emitting array chips 30 through use of an Au line 33 and by means of wiring bonding.

A driver IC chip must be disposed on either side of an LED array chip having a high density of light-emitting points for use with a high-definition printer. For this reason, difficulties are encountered in reducing the width of the substrate 32 to a certain extent or more. The substrate 32 on which the driver IC chip 31 is disposed on either side of the light-emitting array chip 30 usually assumes a width of about 12 mm to 20 mm.

A space of 5 mm to 10 mm width is required for mounting connectors for drawing wires from the substrate 32 or for soldering a flexible printed circuit film or sheet.

In order to prevent an increase in the width of the substrate 32, which would otherwise be caused by ensuring a wiring space, the related-art technique has hitherto employed a method of elongating a substrate in a primary scanning direction and mounting connectors in a range on the substrate where no light-emitting device array chips are to be present, through use of through holes; a method or mounting connectors on the reverse surface of a substrate by means or surface mount technique; or a method of mounting a flexible printed circuit film or sheet on the reverse side of a substrate by means of soldering.

In order to reduce the number of wires to be bonded to the LED arrays, inventions have been proposed [Japanese Patent Application Laid-Open Nos. 238962(1989), 14584 (1990), 92650 (1990), and 92651 (1990)], wherein light-emitting thyristors of a p-n-p-n structure are adopted as constituent elements of the light-emitting array, thereby enabling self-scanning or light-emitting points. The inventions describe the ability to facilitate mounting of light-emitting thyristors as a light source for an optical printer, to reduce an area within which light-emitting devices chips are to be mounted, and to manufacture a compact light-emitting device.

Further, an invention has been proposed [Japanese Patent Application Laid-Open No. 263668(1990)], in which a switching device array is taken as a transfer section and is isolated from a light-emitting device (i.e., light-emitting thyristor) array.

FIG. 12 shows an equivalent circuit of the self-scan-type light-emitting array. The light-emitting device is made up of an array of transfer thyristor devices T(1), T(2), ... and light-emitting tyristors L(1), L(2), ... The drawing shows only a portion of the array. The transfer thyristor devices T(1), T(2), ... are connected by means of diodes D1, D2, ... $V_{GA}$ denotes a power line (usually assuming −5V) which is connected to a gate electrode of each of the thyristor devices T and L. A start pulse signal $\Phi_s$ is applied to the gate electrode of the thyristor device T(1). Clock pulse signals $\Phi_1$ and $\Phi_2$ are applied to cathode electrodes of alternating thyristor devices T. The gate electrodes of the transfer thyristor devices T(1), T(2), ... and the corresponding gate electrodes of the light-emitting thyristor devices are interconnected by means of wires G(1), G(2), ... A write signal $\Phi_I$ is applied also to the cathode electrodes of the light-emitting thyristor devices L.

In the above-described circuit configuration, the thyristor devices T(1), T(2), ... are sequentially turned on by means of the two clock pulse signals $\Phi_1$ and $\Phi_2$. In association with such turning-on action, the light-emitting thyristors L(1), L(2), ... enter a state in which they can be turned on sequentially. If any one of light-emitting thyristor devices is turned on or enters a luminous state, the luminous intensity of the light-emitting thyristor device is determined by the amount of electric current to flow as a write signal $\Phi_I$; that is, by resistance $R_I$. An image can be written at arbitrary intensity. As can be seen from FIG. 12, the self-scan-type light-emitting array of such a configuration requires interconnection of only a total of six terminals per chip; that is, two power terminals and four signal terminals. Thus, the number of connections does not depend on the number of light-emitting devices mounted on one chip. Hence, in a case where 128 light-emitting devices, for example, are mounted per chip, the number of wires to be connected to a drive IC per chip can be reduced to one-twentieth those required for a related-art LED array chip.

By replacing a related-art LED array chip with the self-scan-type light-emitting array chip, a driver IC can be readily mounted on a substrate differing from that having light-emitting devices mounted thereon (see Japanese Patent Application Laid-Open No. 187981/1997). As shown in FIG. 13, a substrate 42 having light-emitting device array chips 40 mounted thereon is disposed opposite a rod lens array 44. A substrate 45 having the driver IC mounted thereon is separated from the substrate 42. The substrates 42 and 45 are connected together by means of a flexible printed circuit (FPC) film or sheet 47, The FPC substrate 47 is connected Lo the substrates 42 and 45 by means or soldering or through use of connectors. Such a construction can be said to be a method of reducing the width of the substrates and miniaturizing an optical write head more effectively than a method using the related-art LED array chin.

As mentioned above, in a case where the substrate having light-emitting devices mounted thereon is separated from the substrate having a driver IC mounted thereon, a certain number of wires, to be used for interconnecting the substrates are required. The wires are greater in number than those required when drawing wires, to the outside, from a substrate having light-emitting devices and a driver IC mounted thereon. The wires can be integrated simply by use of an FPC substrate. However, much space to be used for mounting connectors or space for soldering must be ensured on the substrate having light-emitting devices mounted thereon. Hence, the width of the substrate cannot be diminished much.

The present invention has been conceived to solve the drawback set forth and is aimed at providing a compact optical write head which substantially obviates a necessity of optical adjustment, thereby embodying a high-resolution electrophotographic printer.

(III) A light-emitting diode (LED) array has usually been used widely as a light-emitting device array. Each of the LED devices involves variations in the amount of light emission. Further, each of rod lenses involves variations in optical characteristic. These variations account for inconsistencies in density of an image. If a currently-available LED array is used in its present form, variations in density will exceed the allowable density limit of the LED. For this reason, the amount of light is corrected such that inconsistencies in density of an image fall within the allowable density limit of an LED, by means of changing drive conditions for each of LEDs. The amount of light is usually corrected in accordance with the following procedures. While the optical write head is separated from the printer, LEDs are illuminated one by one, and a light-receiving element is situated at a position where an image is to be formed thereby determining the distribution of light quantity over the head in its longitudinal direction. The thus-determined distribution of light quantity is recorded. A per-chip drive current to be supplied to LEDs or the period of illumination of the respective chip or LEDs is determined from the recorded light quantity distribution such that the light quantity distribution is flattened. At the time of actual use of the light-emitting array, the thus-determined drive conditions are employed.

However, in practice, an optical write head is assembled or used in the environment where ambient temperature changes. The positional precision of layout of light-emitting device array chips is influenced by thermal expansion of a glass epoxy substrate. Further, the positional precision of layout of a rod lens array is influenced by thermal expansion of glass-fiber-reinforced plastic (GFRP). Accordingly, there may be a case where the optical axis of a light-emitting array chip and the optical axis of a rod lens may deviate from an initially-adjusted position in the longitudinal direction of the print head. Inconsistencies in an image stemming from such deviation cannot be compensated by the electrical correction of light quantity set forth.

Even in a process of die-bonding light-emitting device array chips to a substrata, heating is required for setting a conductive adhesive in the course of a cooling operation for setting the thus-heated adhesive, residual stress develops between the chip and the substrate. The residual stress induces distortion in the substrate, thereby deteriorating the positional precision of the chip. Even a pitch between the chips encounters the same problem.

The present invention is aimed at solving the foregoing drawback, providing an optical write head having high reliability with respect to temperature variations, and realizing a high-resolution electrophotographic printer.

SUMMARY OF THE INVENTION

The present invention has been conceived to solve the problems set forth.

According to a first aspect of the present invention, there is provided an optical write head comprising a substrate, and a plurality of light-emitting device array chips arranged on the substrate in a straight line or in a staggered layout so as to oppose a gradient index rod lens array, each of the light-emitting array chips having a light-emitting device array, wherein the rod lens array, a substrate support member for supporting the substrate, and a driver circuit board are fixedly held by a support member.

Preferably, the support member and the substrate support member are formed from metallic material. Further, at least one of frames of the rod lens array to be bonded to a support member is preferably a glass plate.

Preferably, a plurality of adhesive injection holes are formed in a surface of the support member to which the rod lens array is to be brought into contact, arranged in a longitudinal direction of the rod lens array and formed so as to penetrate through the support member to a reverse side thereof. Alternatively, at least one slit of V-shaped cross section for injecting an adhesive is preferably formed in a portion of the surface of the support member to be brought into contact with the rod lens array, so as to extend in the longitudinal direction of the rod lens array, and a plurality of adhesive injection holes are formed in the slit so as to penetrate through the support member to a reverse side thereof.

Preferably, at least two positioning pins are provided at predetermined positions on the support member so as to come into contact with the substrate or the substrate support member. Alternatively, at least two eccentric pins capable of penetrating through the support member and rotating are preferably provided so as to come into contact with the substrate support member.

Preferably, the two eccentric pins are rotated, to thereby move the substrate support member remaining in contact with the eccentric pins and to adjust the distance between a light-emission section of the light-emitting device array and a light-incident end face of the rod lens array. Further, light-emitting array chips are preferably die-bonded to a substrate bonded to predetermined locations on the substrate support member while the position of the substrate is taken as a reference plane of the substrate support member.

Further, the substrate may be a flexible printed circuit substrate (FPC film or sheet). Moreover, the light-emitting device array may be a self-scan-type light-emitting device array (see, for example, U.S. Pat. No. 5,177,405).

According to a second aspect of the present invention, there is provided an optical write head in which light-emitting array chips are mounted directly on a flexible print circuit substrate (a FPC film or sheet). The FPC substrate is brought, in advance, into close contact with a member possessing rigidity. The FPC substrate is of multilayer type and preferably has a thickness of 30 to 50 $\mu$m. As to the optical write head according to the present invention, a self-scan-type light-emitting device array is suitable as the light-emitting device array.

The optical write head according to the present invention is assembled in the following manner. A portion of the FPC substrate is bonded in advance to a member having rigidity. Next, light-emitting array chips are arranged on and directly die-bonded to the FPC substrate in the form of a straight line or in a staggered layout. Wire bonding pads provided on the light-emitting device array chips and wire bonding pads provided on the FPC substrate are electrically interconnected by means or wire bonding. Subsequently, the member having rigidity is mounted at a predetermined position on a support member having the rod lens array and the light-emitting array driver circuit mounted thereon.

The present invention proposes direct die-bonding of light-emitting array chips onto an FPC element (a flexible printed circuit film or sheet). As a result, a necessity of interconnecting the substrate having light-emitting devices mounted thereon and the driver circuit using a connector can be obviated. Since mounting of connectors to the substrate is obviated, the area of the substrate can be minimized correspondingly.

Accurately arranging and fixing chips on a flexible substrate is not easy. Further, wire-bonding chips onto resin which poses difficulty in propagation of ultrasonic waves is also difficult. For these reasons, a member having rigidity is brought into close contact with the reverse side of an area of the substrate at which chips are to be mounted. Further, the thickness of the FPC substrate is made as small as possible. In this state, the precision of positions of chips required by the optical wire head can be ensured by means of die-bonding or wire-bonding light-emitting array chips on the substrate. Further, electrical connection can be established easily. There can be prevented deformation of the area of the substrate in which chips have been mounted, which would otherwise be caused when the chips are mounted. Further, breakage or wire-bonded Au lines or rupture of chips can be prevented.

In a case where wires must be drawn to either side of a chip because of design or a light-emitting device array chip, wires can be drawn readily by use of an FPC substrate of multilayer type. By means of such a construction, the substantial area of the substrate can be reduced much further, thereby improving the freedom of design of an optical write head.

A member which has rigidity and is mounted on an FPC substrate is embodied as a single constituent component of an optical write head, thereby enabling very simple and highly accurate assembly of an optical write head.

According to a third aspect of the present invention, there is provided an optical write head comprising a flexible printed circuit substrate (a FPC film or sheet) remaining in close contact with a member having rigidity, and a plurality of light-emitting device array chips arranged on the FPC film or sheet in a straight line or in a staggered layout so as to oppose a gradient index rod lens array, each of the light-emitting array chips having a light-emitting device array, wherein the member having rigidity is a metallic member substantially equal in coefficient of thermal expansion to the rod lens array. Preferably, the member having rigidity is a metallic member substantially equal in coefficient of thermal expansion to the light-emitting device array chips.

Preferably, a frame of the rod lens array is formed from glass, and the metallic member is a nickel alloy or titanium Further, in a case where the light-emitting device array chips are formed from GaAs-based semiconductor, the member having rigidity can be made substantially equal in coefficient of thermal expansion to the light-emitting device array chips, as a result of use of the metallic material. Preferably, a self-scan-type light-emitting device array is used for the light-emitting device array.

The present disclosure relates to the subject matter contained in Japanese patent application Nos. 2000-104786 (filed on Apr. 6, 2000), 2000-213005 (filed on Jul. 13, 2000), 2000-213006 (filed on Jul. 13, 2000), and 2000-310815 (filed on Oct. 11, 2000) which are expressly incorporated herein by reference in their entireties.

DESCRIPTION OF THE PREFERRED EMBODIMENT

Figure 1:
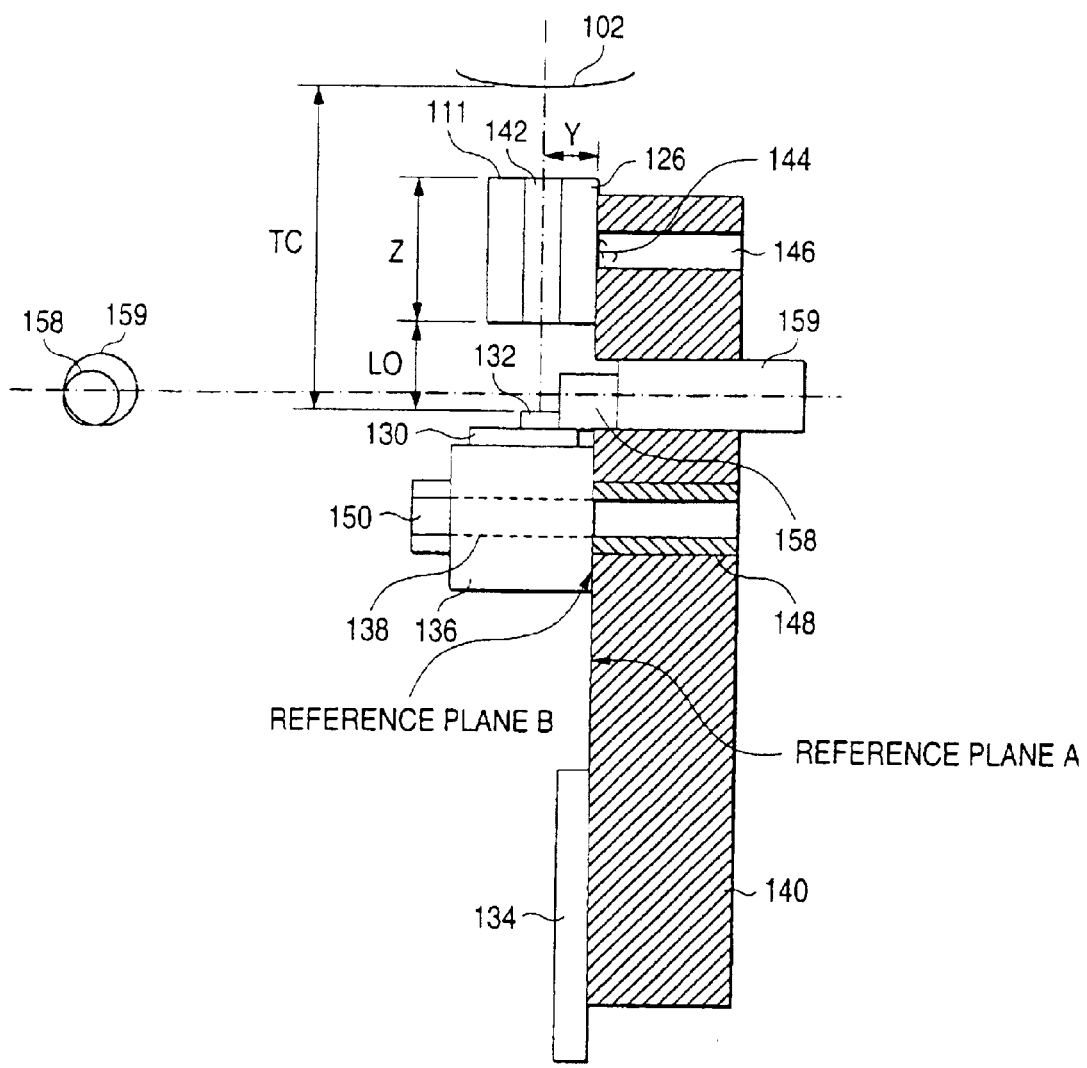
FIG. 1 is a cross-sectional view showing an optical write head according to an embodiment of the present invention.
Figure 2:
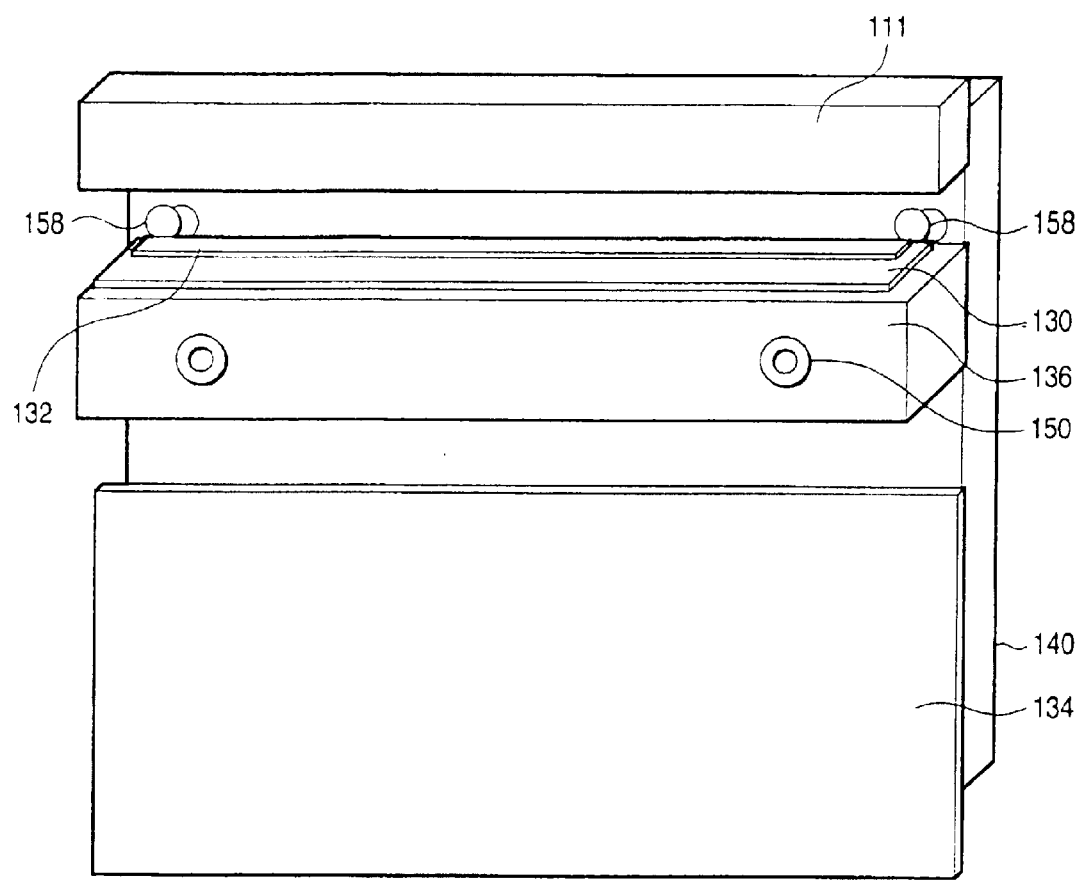
FIG. 2 is a front perspective view showing the optical write head according to the embodiment.
Figure 3:
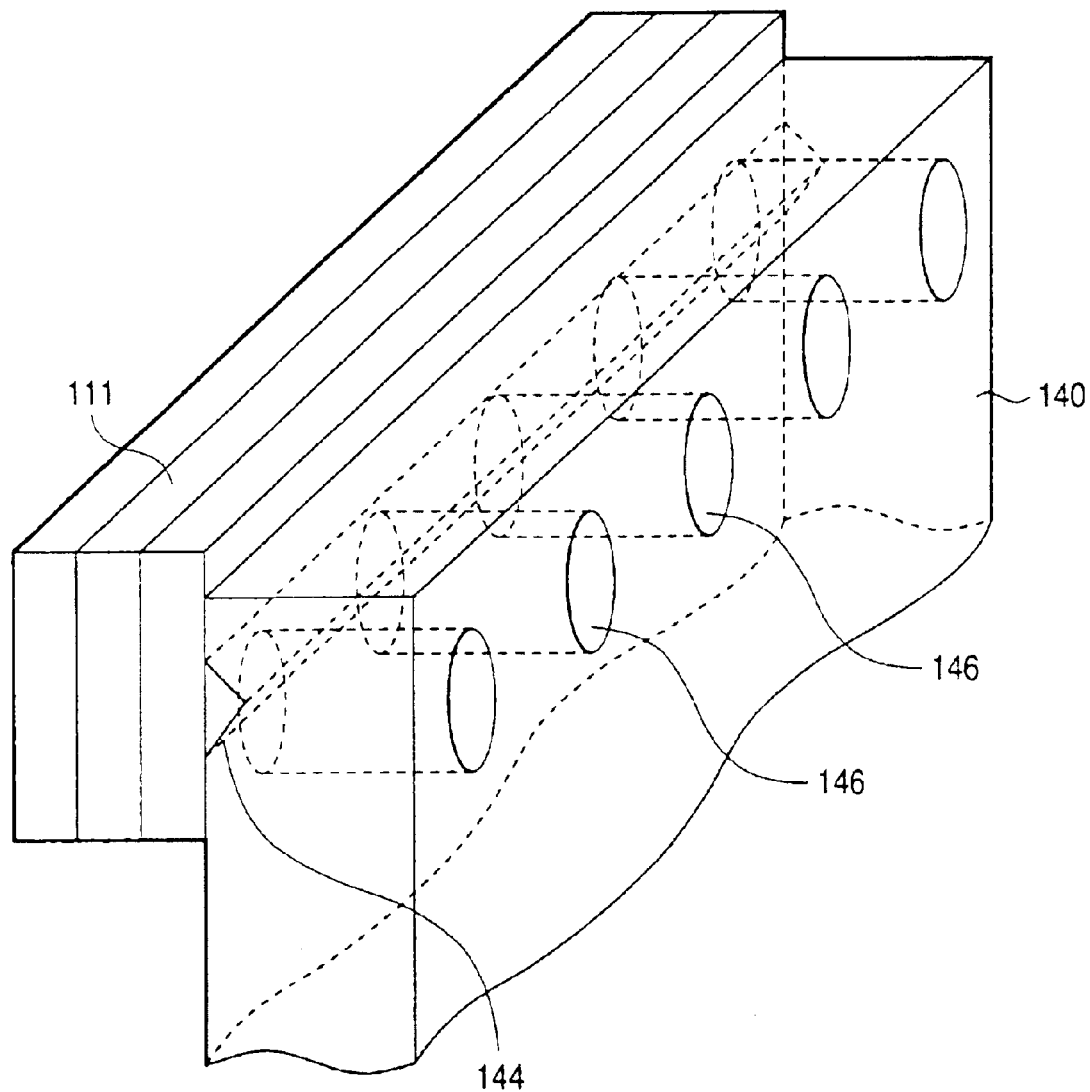
FIG. 3 is a back perspective view showing the optical write head according to the embodiment.

FIG. 1 is a cross-sectional view showing the structure of an optical write head according to the present invention. FIG. 2 is a schematic perspective view of the structure when viewed from the front. FIG. 3 is a schematic perspective view of a portion of the structure when viewed from the reverse side. An example structure of the optical write head which maintains the precision of an optical axis will now be described by reference to these drawings.

Light-emitting device array chips 132 are mounted on a substrate 130, A light-emitting device array illuminates in response to an electric signal output from a driver circuit board 134. The light forms an image on a photosensitive drum 102 by way of a rod lens array 111. The substrate 130 is bonded to a substrate support member 136. As shown in FIG. 1, the rod lens array 111, the substrate support member 136, and the driver circuit board 134 are bonded to a reference plane A of a support member 140.

First, there will be described a method of positioning the center of an optical axis.

A reference plane A of the support member 140 is a precision-machined plane. The rod lens array 111 is positioned in the thicknesswise direction thereof, by means of bringing a frame 126 of the rod lens array 111 into close contact with the reference plane A. However, FRP is usually employed for the frame 126 of the rod lens array 111, and the frame 126 has a thickness precision of about ±0.4mm. Such thickness precision accounts for the occurrence of variations in distance from the outer surface of the frame to the center of the rod lens. In addition, orientation of glass fibers of FRP results in irregularities arising in the surface of FRP. Even at the time of manufacture of a rod lens array, the row of rod lenses is disarranged when rod lenses are arranged on an FRP plate.

In order to prevent occurrence of disarrangement, a low-cost glass plate having superior thickness precision is used as the frame 126. As a result, the precision of distance between the center of an optical axis 142 of the rod lens and the outer surface of the frame can be improved so as to fall within a range of ±15 μm. Further, disarrangement of rod lenses can also be eliminated. Ordinary soda lime glass cut to a predetermined size can be used as a glass plate. Hence, the glass plate is inexpensive.

In a case where the rod lens array 111 is bonded to the support member 140, the precision of thickness of an adhesive cannot be guaranteed. In order to guarantee the thickness precision, there has been conceived a method of bonding the rod lens array 111 to the support member 140 without being sensitive to the precision of thickness of an adhesive.

As shown in FIG. 3, at least one slit 144 having a V-shaped cross section is formed in the surface of the support member 140 which is to come into contact with the frame 126 of the rod lens array 111, so as to extend in the longitudinal direction of the rod lens array 111. A plurality of adhesive injection holes 146 are formed at appropriate intervals in the slit 144 so as to penetrate the support member 140 to the reverse side thereof.

In a case where warpage arises in the rod lens array itself, the support member 140 and the rod lens array 111 are positioned while longitudinal warpage and lateral warpage in the rod lens array 111 are corrected, thereby pressing the rod lens array 111 against the support member 140 under an appropriate load. For instance, an instantaneous adhesive of low viscosity is poured onto the surface of the support member 140 which is to come into contact with the frame 126 of the rod lens array 111, by way of the adhesive injection holes 146. The adhesive can spread over an adhesion surface across the entire length of the rod lens array 111 by way of the slit 144 and by means of capillary action.

Alternatively, an epoxy-based adhesive of low viscosity is poured into the adhesive injection holes 146. The rod lens array 111 may be bonded by means of only an adhesive poured into dot shapes at a plurality of points corresponding to the adhesive injection holes 146. In this case, the slit 144 is obviated, and the only requirement is that a plurality of adhesive injection holes 146 be formed at appropriate intervals in the surface of the support member 140 which is to come into contact with the frame 126 of the rod lens array 111, in the longitudinal direction of the rod lens array 111 so as to penetrate the support member 140 to the reverse side thereof.

According to the method, the adhesive does not enter a gap between the surface of the rod lens array 111 and the surface of the support member 140, thereby preventing occurrence of variations in precision of thickness of the adhesive.

In consideration of ease of precision working of the surface of the support member 140, the influence of temperature and physical shock on the precision of the support member 140, and time-varying changes in the material of the support member 140 due to residual stress of the material, metallic material is preferably selected for the support member 140. Even in this regard, forming the frame 126 of the rod lens array 111 from glass material whose coefficient of thermal expansion is closer to that of metal than to that of FRP is effective for preventing exfoliation of the rod lens array 111 from the support member 140, which would otherwise be caused by temperature changes.

There will now be described a method of positioning the light-emitting device array chips 132. When the light-emitting device array chips 132 are die-bonded to the substrate 130, die-bonding is effected while a pattern of given geometry printed on the substrate 130 is recognized as an image. In this case, when the substrate 130 is mounted on an optical write head, there is no alternative but to take the end face of the substrate 130 as a reference plane.

The precision of distance between the end face of the substrate 130 and illumination points of the light-emitting device array chips 132 and parallelism between the substrate 130 and the illumination points are not ensured during manufacturing processes. Aligning the light-emitting device array chips 132 to the optical axis 142 of the rod lens array 111 by means of laying out a mechanism is impossible.

In order to make alignment feasible, the substrate 130 is bonded to the support member 136 or secured to the same by means of another method before the light-emitting device array chips 132 are mounted on the substrate 130. Next, the light-emitting device array chips 132 are die-bonded onto the substrate 130, by means of taking a precision-machined reference plane B of the substrate support member 136 as a reference. Subsequently, the reference plane A of the support member 140 and the reference plane B of the substrate support member 136 are fixed together by means of butt-joining. The precision of distance Y between the reference plane A of the support member 140 and the illumination point depends only on the precision of a die bonder, and a range of ±10 μm is ensured for the distance Y between the reference plane A and the illumination point. The substrate support member 136 is secured to the support member 140 by means of forming through holes 138 in the substrate support member 136, forming tapped holes 148 at positions corresponding to the support member 140, and tightly screwing bolts 150 into the tapped holes 148. The diameter or the through holes 130 is made larger than that of the bolts 150, thereby enabling positional adjustment to be described )later. Thus, the amount of offset between the optical axis or the rod lens array 111 and the optical axis of the light-emitting device array 132 can be reduced to a range of ±25 μm by means of the precision of assembly of the mechanical components.

There will now be described a method of positioning the rod lens array 111 in a direction of optical axis operating range LO. As mentioned previously, longitudinal warpage and lateral warpage in the rod lens array 111 are corrected by a jig when the rod lens array 111 is bonded to the support member 140. Further, the warpage is eliminated by use of glass material for the frame 126 of the rod lens array 111. However, variations due to manufacture exist in an operating range TC and the lens length Z. LO has variations falling within a range of ±0.15 mm, and the operating range TC has variations falling within a range of ±0.3 mm, The distance between the rod lens array 111 and illumination points must be set to the operating range of the rod lens array 111, as the occasion requires.

Since the lens operating lens is predetermined, means for adjusting the distance between the rod lens array 111 and the light-emitting devices is required. Two eccentric pins 158 to penetrate through the support member 140 are attached as the adjustment means in the longitudinal direction (see FIG. 2). The eccentric pins 158 rotate eccentrically with respect to eccentric pin housings 159. The eccentric pin housings 159 are secured to predetermined positions on the support member 140, and the tip ends of the eccentric pins 158 are positioned so as to come into contact with the substrate support member 136. The position of the substrate support member 136 is adjusted by means of rotating the two eccentric pints 158 such that the operating ranges TC and LO become specified operating ranges. At the time of adjustment, the bolts 150 are unfastened, and the substrate support member 136 can slide over the support member 140. After positioning, the substrate support member 136 is fastened.

Figure 4:
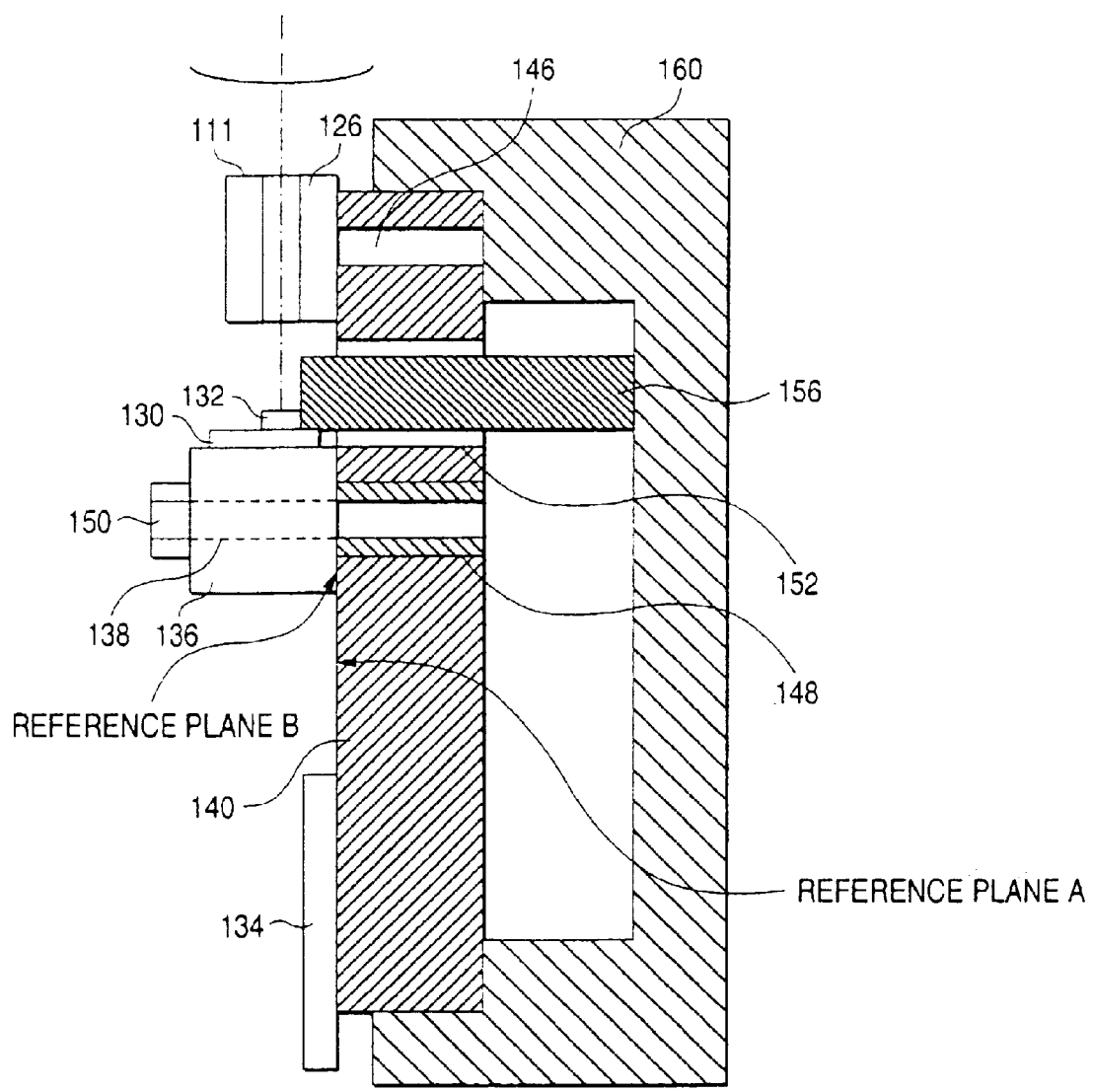
FIG. 4 is a cross-sectional view showing an optical write head according to another embodiment of the present invention.

A method shown in FIG. 4 may be employed as a method of positioning the rod lens array 111 in a direction of optical axis operating range LO, The support member 140 is held at a fixed position on a head housing 160. Two through holes 152 are formed at positions between the rod lens array 111 of the support member 140 and the substrate support member 136 in the longitudinal direction. Two positioning pins 156 set at positions of specified values beforehand are inserted into the through holes 152 until the pins 156 protrude from the surface of the support member 140. The diameter of the through holes 152 is made larger than that of the positioning pins 156, thereby preventing the positioning pins 156 from coming into contact with the interior surfaces of the through holes 152. While the positioning pins 156 are taken as reference pins, the substrate support member 136 is fastened so as to come into contact with the positioning pins 156. As a result, an appropriate range LO can be ensured in accordance with variations in operating range.

The driver circuit board 134 is secured to the support member 140. As A result, wires to be provided between the substrate 130 having the light-emitting device array chips 132 mounted thereon and driver circuits can be shortened, thus diminishing influence of noise and miniaturizing the optical write head.

The optical write head according to the embodiments of the present invention enables high-resolution and easy alignment of the optical axis of the rod lens array to illumination points of the light-emitting devices while the surface of the support member is taken as a reference plane. Further, the operating range of the optical axis of the rod lens array can also be adjusted easily. The positional precision of the rod lens array can be sustained stably over time. Hence, there can be embodied a low-cost optical write head which enables writing of a high-resolution image.

In these embodiments, the substrate 130 may be a flexible printed circuit substrate (a FPC film or sheet), and the light-emitting array chips 132 may be constructed as a self-scanning, light-emitting device as disclosed, for example, in U.S. Pat. No. 5,177,405.

Figure 5:
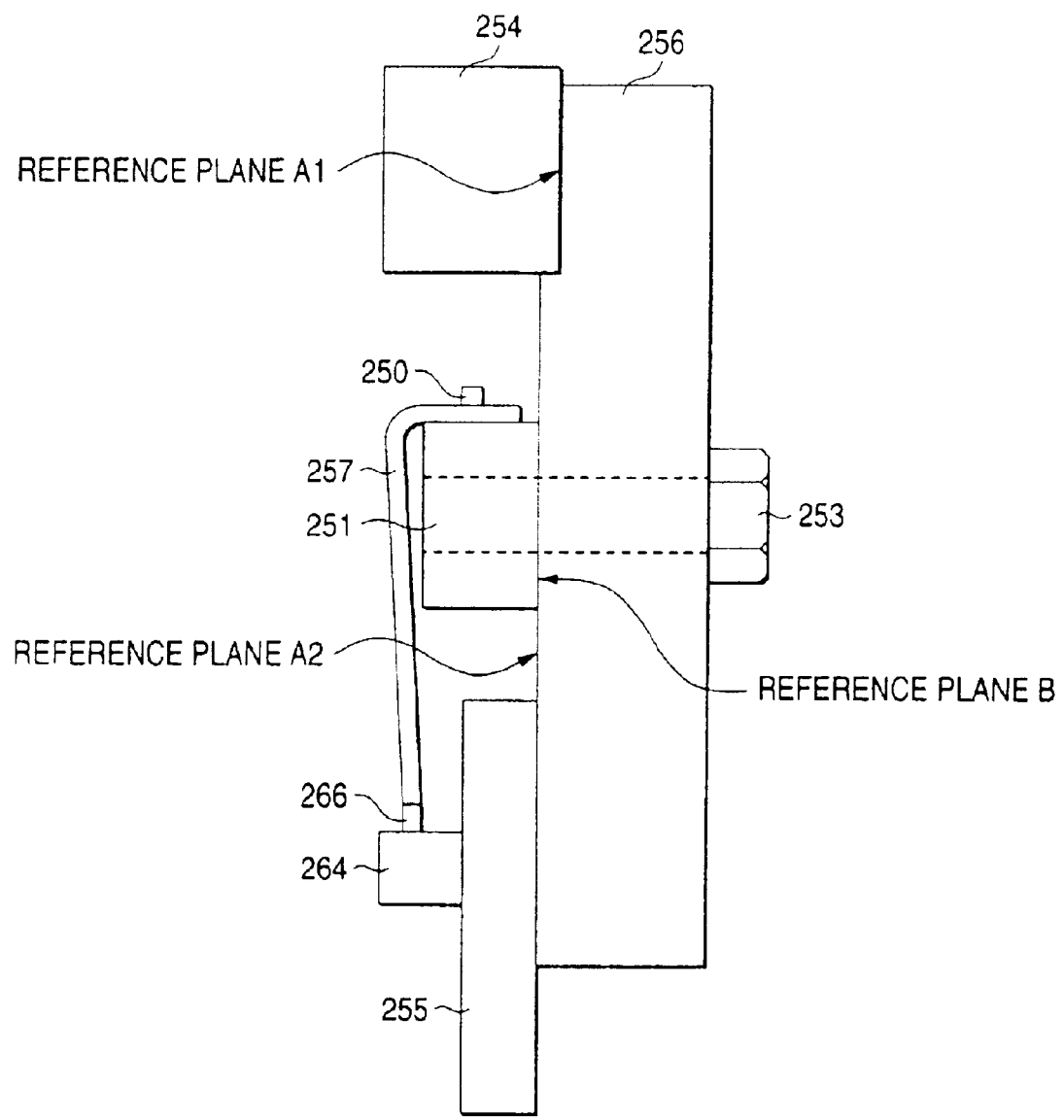
FIG. 5 is a side view of an optical write head according to yet another embodiment of the present invention.
Figure 6:
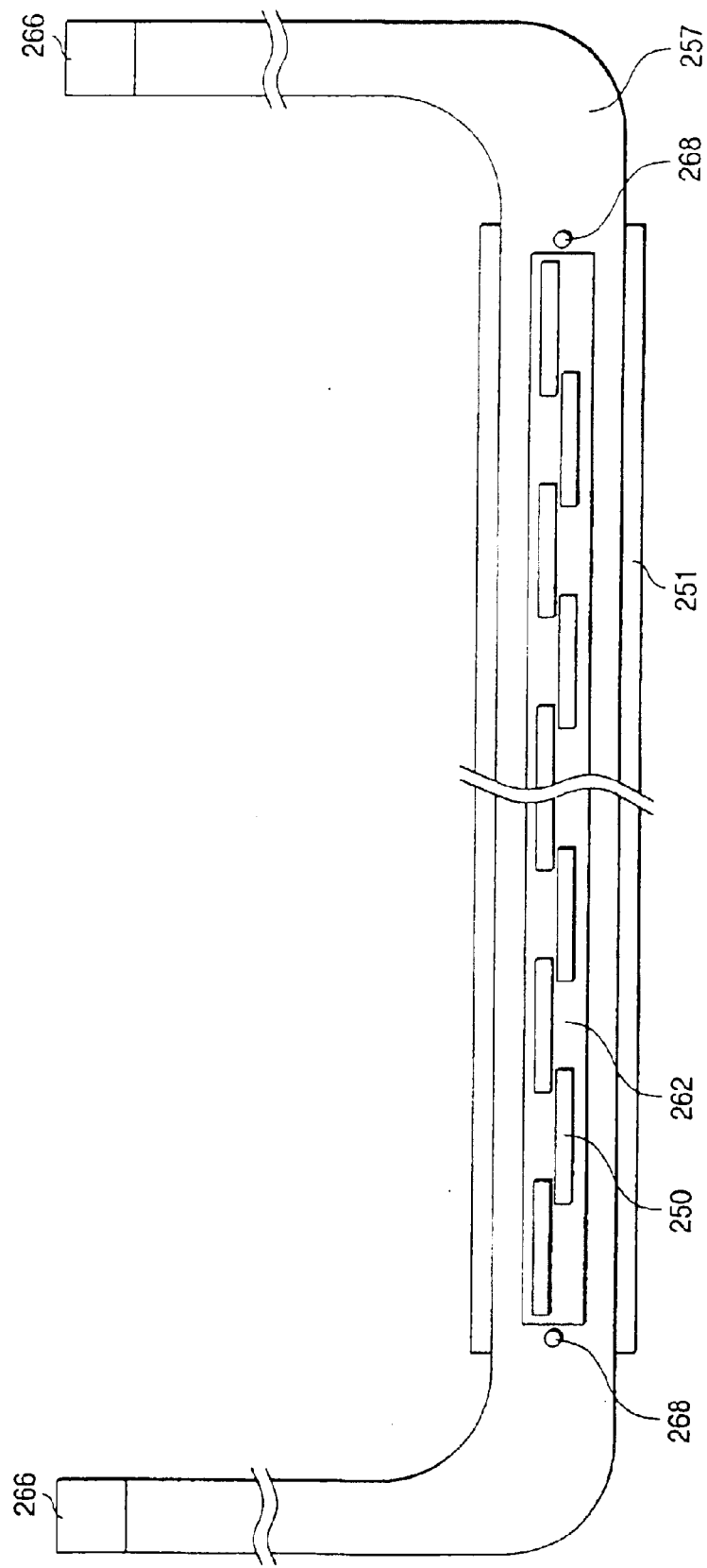
FIG. 6 is a plan view showing a portion of the optical write head having light-emitting device array chips mounted thereon.
Figure 7:
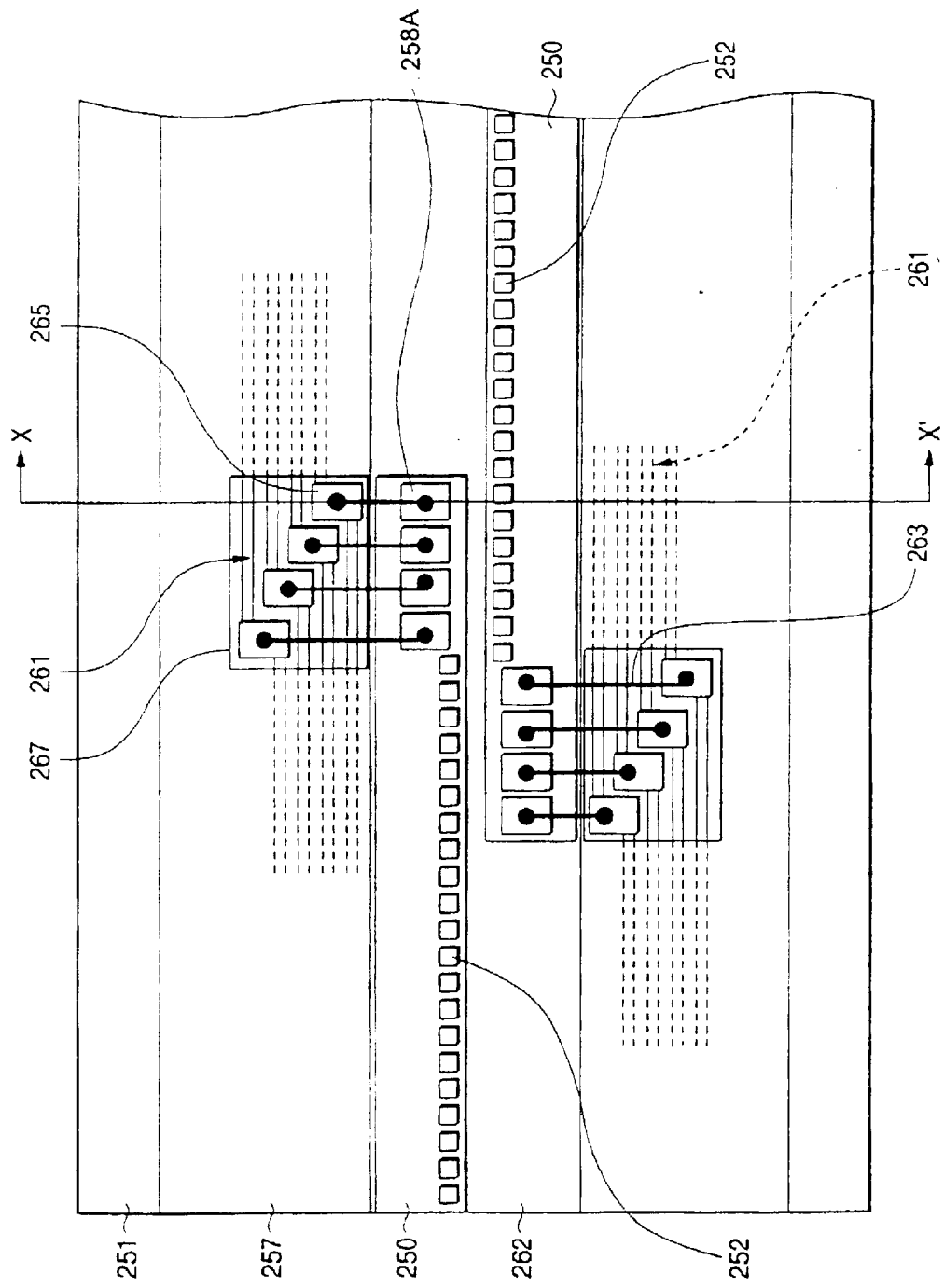
FIG. 7 is a partially-enlarged plan view showing a portion or the optical write head having light-emitting device array chips mounted thereon.
Figure 8:
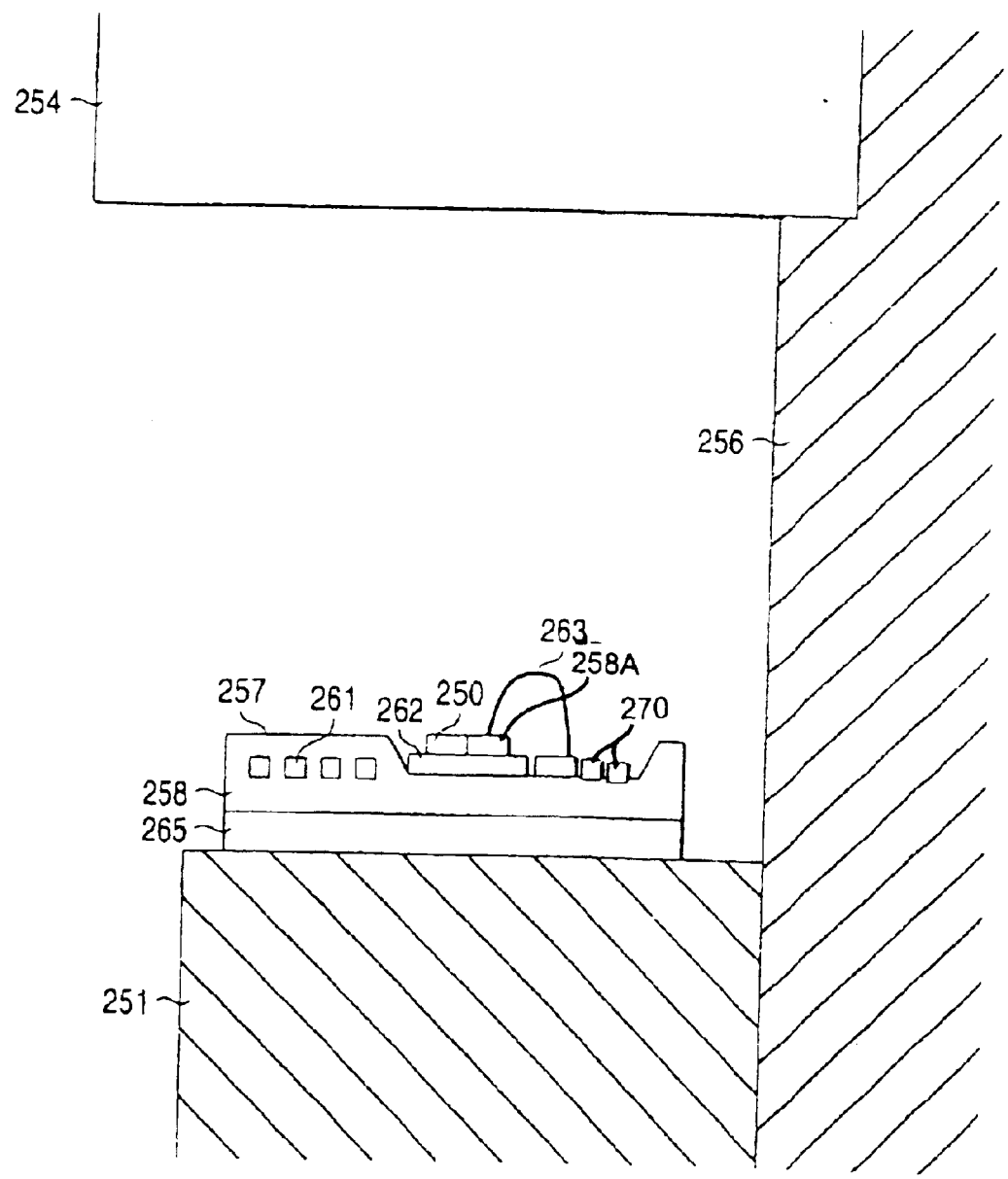
FIG. 8 is a cross-sectional view showing the principal section of the optical write head.
Figure 9:
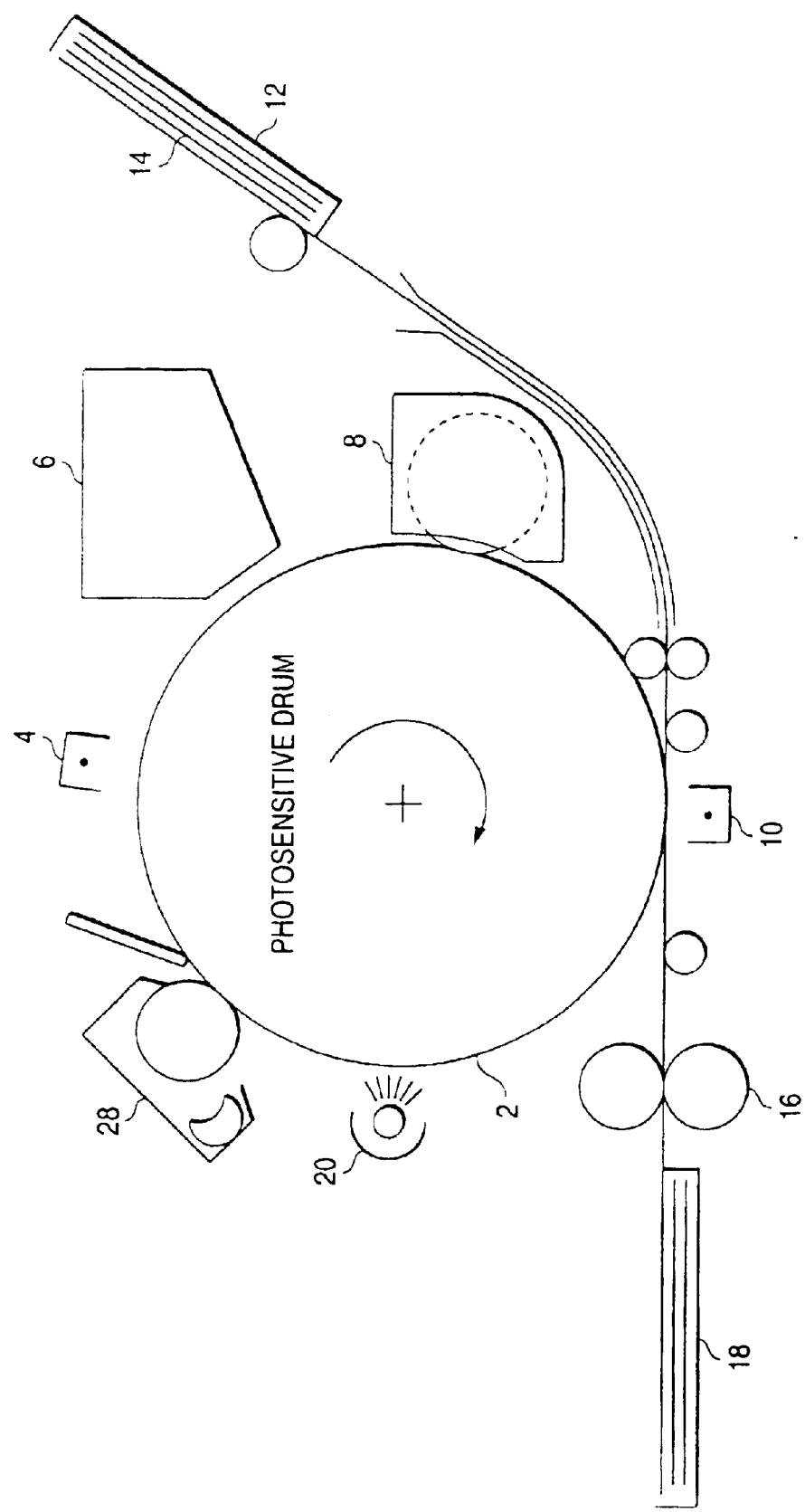
FIG. 9 is a schematic view showing the principle of an optical printer equipped with an optical write head in a related art.
Figure 10:
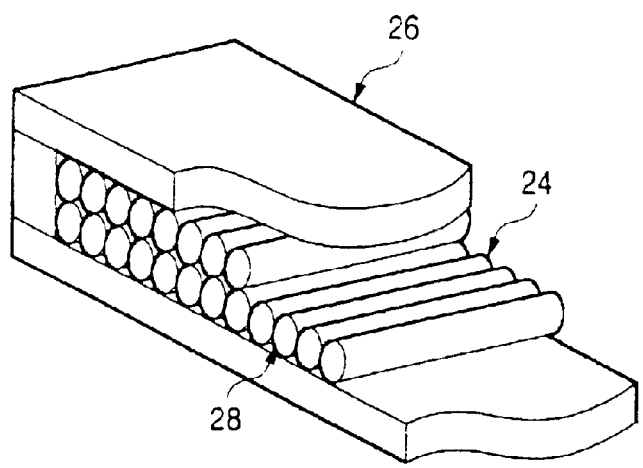
FIG. 10 is an illustration showing the structure of a gradient index rod lens array in a related art.

Another embodiment of the present invention will be described hereinbelow by reference to FIGS. 5 through 8. FIG. 5 is a side view showing the side of an optical write head according to the present invention, the side being perpendicular to a primary scanning direction. FIG. 6 is a plan view showing a portion of the optical write head on which a light-emitting device array chip is mounted when viewed from top of a surface from which light exits. FIG. 7 is a partially-enlarged view of the plan view shown in FIG. 6. FIG. 8 is a cross-sectional view taken along line X-X' shown in FIG. 7. In order to make the drawings easily understandable, the drawings are partially simplified. For this reason, the number of patterns and wire bonds on an FPC film or sheet is inevitably represented incorrectly.

A two-layer FPC substrate (film or sheet) 257 has copper-foil wiring patterns 261 sandwiched between resin layers 258 formed from heat-resisting resin, such as polyimide. The FPC substrate 257 is bonded to a metal block 251 formed from metallic material, by means of a thermosetting adhesive 365 (see FIG. 8). The number of layers of FPC substrates 257 may be increased, as necessary. Self-scan-type light-emitting device array chips 250 are mounted into a row and at predetermined locations on the surface of copper foil 262 laid on the surface of the FPC substrate bonded to the metal block 251. The array chips 250 are arranged by means of a die bonder and fixed by means of a conductive adhesive. FIG. 6 shows an example in which the array chips 250 are arranged in a staggered layout. However, the array chips 250 can be arranged in a straight line. Before the FPC substrate 257 is assembled into an optical write head, electrode pads 258A provided on the light-emitting array chips 250 having the light-emitting devices 252 mounted thereon are electrically connected, by means of wire bonding, to conductor pads 270 located at predetermined locations within an area 267 of the FPC substrate 257 from which a resin layer has been partially removed.

The light-emitting device array chip 250 having a structure such as that shown in FIG. 7 is designed for a staggered layout. In this case, the Au lines 253 cannot be provided so as to straddle the light-emitting devices 252. Hence, the bonding pads 265 to be provided on the FPC substrate 257 must be provided on either side of the respective array chips 250. In this case, use of an FPC substrate of multilayer type is an absolute requirement.

As shown in FIG. 5, a metal block 251 is subsequently mounted on a support member 256 having rigidity, by use of means such as a bolt 253. A rod lens array 254 is bonded to a predetermined location on the support member 256 through use of an adhesive. Moreover, a drive circuit board 255 is mounted on the support member 256 as well. A terminal 266 provided on either end of the FPC substrate 257 is connected to a corresponding connector 264 provided on the driver circuit board 255, thereby enabling supply of a drive signal to the light-emitting devices. Such a construction enables realization of the width of the substrate in the sub-scanning direction which is two-fifths that of the related-art substrate.

The optical axis of the rod lens array 254 and the optical axes of the light-emitting devices are preferably aligned with each other, by means or only mechanically fixing the rod lens array 254 to the support member 256. Means to be used for alignment will be described later.

Figure 11:
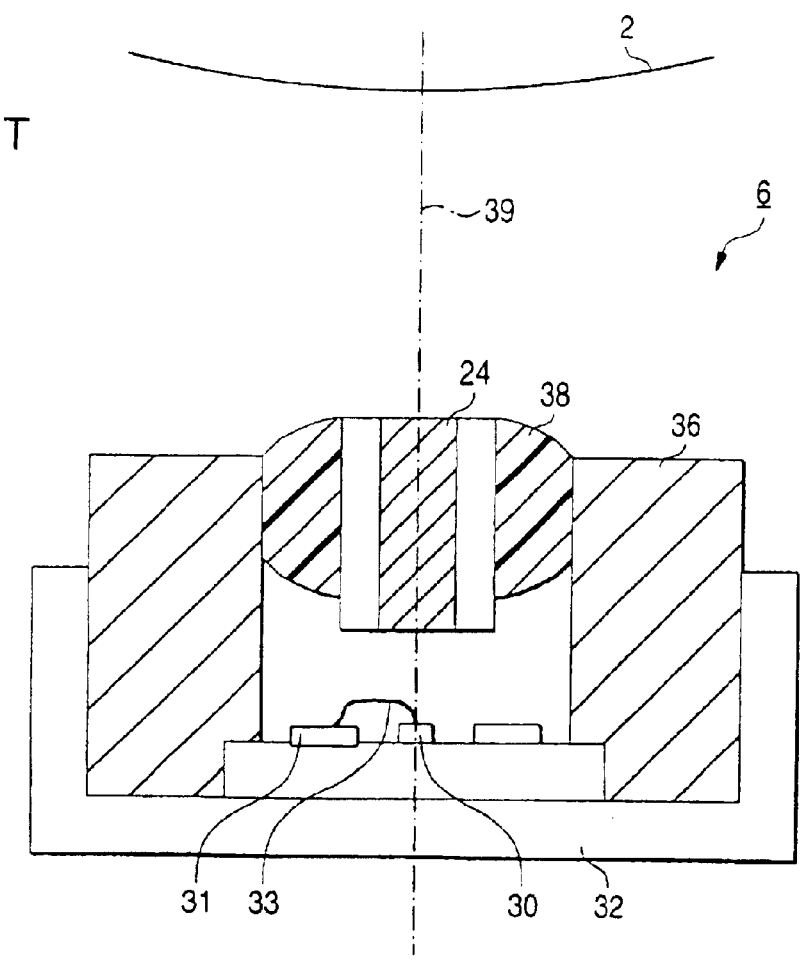
FIG. 11 is a schematic cross-sectional view showing the construction of an optical printer head in a related art.
Figure 13:
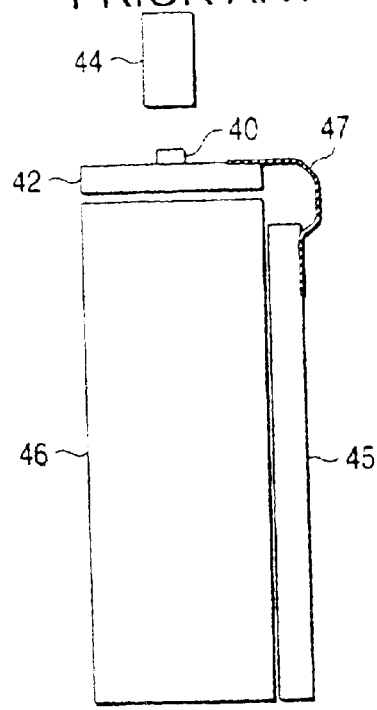
FIG. 13 is a schematic cross-sectional view showing the construction of another related-art optical printer head

In order to obtain a good image, a working distance of the rod lens array 254 (i.e., distance between the end faces of rod lenses and the surfaces of the light-emitting devices) must be set to ±30 μm of a specified value. A related-art glass epoxy substrate (having a thickness of 1.0 to 1.6 mm) has a thickness precision of ±0.13 mm or thereabouts. In a case where the structure shown in FIG. 11 or 13 is employed, the height precision of the light-emitting device array chip depends on the thickness precision of the glass epoxy substrate and fails to fall within an allowance of ±30 μm.

In connection with the FPC substrate, a proportional relationship exists between the thickness of a layer and its allowance. Hence, minimizing the thickness of the FPC substrate is desirable. The present embodiment employs a copper foil having a thickness of 18 μm, an FPC substrate (having a thickness of 43 μm) having a resin sheet of 25 μm thickness, and an adhesive of 25 μm thickness applied between a metal block and the FPC substrate. The thickness precision of the FPC substrate is about 10 to 15% the total thickness of the FPC substrate. In the case of the FPC substrate employed in the present embodiment, a thickness precision of 11 μm=(25+18+25 μm)×15% can be obtained. In order to maintain the tolerance, the thickness of a layer must be set to a maximum of 100 μm. In contrast, a thinner layer is preferable. However, a copper foil cannot be made very thin. In consideration of electrical insulation, under the present circumstances the resin sheet must have a thickness of 12 μm or more. As mentioned above, we can say that the thickness of the FPC substrate preferably falls within a range of 30 to 50 μm, in terms of thickness precision and an electrical insulation characteristic.

In order to increase the ease of bonding Au lines to the FPC substrate by means of wire bonding, selection of the type of an FPC substrate which obviates use of an adhesive between a resin layer and a copper foil is desirable. The FPC substrate of this type has lower absorption of ultrasonic waves, thereby enabling a stable wire bonding operation. Further, the FPC substrate of this type has superior dimensional stability and is suitable for accomplishing the object of the present invention.

In the present invention, light-emitting device array chips are bonded directly to the FPC substrate. At this time, if in-plane positional accuracy is not maintained, after assembly of an optical head there may arise a complicated operation necessary for aligning the optical axis of the rod lens array with the optical axes of the light-emitting devices.

The rod lens array 254 is supported and mounted on the support member 256 by means of an adhesive. Even when glass is used for the frame of the rod lens array 254, the thickness of the rod lens array 254 has minute variations stemming from production. Even when positional precision between a reference plane A1 and a reference plane A2 of the support member 56 is improved indiscriminately, the accuracy of distance between the center of the optical axis of the rod lens array 254 and the reference plane A2 is not ensured. Hence, the thickness of the rod lens array 254 must be measured in advance.

As measures for ensuring the precision of distance between the position at which the light-emitting array chips 250 are mounted and a mating reference plane B at which the metal block 251 and the support member 256 are bonded, reference position marks 268 spaced a given distance away from a junction surface of the support member 256 are provided on a bonding surface of the FPC substrate 257 of the metal block 251 (see FIG. 6). More specifically, two circular recesses are provided at the respective ends of a row of the chips 250 mounted on the surface of the metal block 251. The number of marks may be increased further, and the geometry or the marks is not limited to a circular shape. The reference position marks 268 are taken as reference positions for the die bonder, and the amount of offset from the reference positions is computed from data pertaining to the thickness of the rod lens array of 254. The die bonder is set by reference to the offset, thereby defining the distance between the position where the light-emitting array chips 250 are to be bonded and the reference plane B. The metal block 251 is brought into stationary and close contact with the support member 256, thereby basically enabling alignment between the optical axes of the light-emitting devices and the optical axes of the rod lenses. The thickness of the rod lens array 254 is practically leveled in accordance with a required precision.

In the optical write head according to the embodiment of the present invention, even when a substrate having light-emitting devices mounted thereon is separated from a substrate having a driver circuit mounted thereon, the substrate having the light-emitting devices mounted thereon can be miniaturized, and hence an optical write head can be made compact. In this case, optical alignment of the optical write head in the direction of an optical axis and in the direction within a plane perpendicular to the optical axis can be obviated.

In this embodiment, in fixing the rod les array 254 to the reference plane A1 oil the support member 256, the method discussed in connecting with the fixing of the rod lens array 111 to the support member 140 with reference to FIGS. 1 to 4 may be employed. Further, in fixing the metal block 251 to the reference plane A2 of the support member 256, the method discussed in connection with the fixing of the substrate support member 136 to the support member 140 and the positional adjustment of the substrate support member 136 with respect to the support member 140 with reference to FIGS. 1 to 4 may be employed.

Further features of the embodiment shown in FIG. 5 through 8 will be described. In addition, the features described below can be applied to the embodiments shown in FIGS. 1 to 4.

In an apparatus such as an electrophotographic printer, the ambient temperature of the optical write head rises from room temperature at startup of the printer to a temperature of about 65° C., as a result of heating of the optical write head and heating of individual components provided in the printer. Provided that room temperature is 25° C., temperature rises 40° C. from room temperature at the startup of the printer.

A related-art glass epoxy substrate having light-emitting array chips mounted thereon has a coefficient of thermal expansion of $65 \times 10^{-6}$ $deg^{-1}$ or thereabouts. FRP (composite material consisting of a glass fiber mat and thermosetting resin) is used for the frame or an ordinary rod lens array. The coefficient of thermal expansion of FRP involves variations unique to a composite material (i.e., $6 \times 10^{-6}$ $deg^{-1}$ to $16 \times 10^{-6}$ $deg^{-1}$). Control of the variations is difficult.

In a case where a photosensitive drum requires an exposure length of 320 mm (so as to comply with a size slightly larger than A3, the extent to which a substrate having light-emitting devices mounted thereon is to expand is $65 \times 10^{-6}$ $deg^{-1} \times 40$ deg.$\times 320$ mm=0.83 mm. The extent to which SLA is to expand is $6 \times 10^{-6}$ $deg^{-1} \times 40$ deg.$\times 320$ mm=0.077 to 0.20 mm. When the position on one end of the optical write head is taken as a reference position, a maximum difference in coefficient of thermal expansion arising between the substrate and the rod lens array in its lengthwise direction is 0.76 mm.

The diameter of a high-resolution rod lens is about 0.6 to 1 mm. The lens provided on the end opposite to the reference position is offset from the light-emitting devices by about one lens element. Per-lens variations in coupling efficiency of a lens and inconsistencies in light-quantum cycle induce changes in a corrected light-quantity value, which in turn induces inconsistencies in the amount of light.

Further, variations in coefficient of thermal expansion of the glass epoxy substrate stemming from heating of light-emitting devices elongate the width of an image appearing on a light-receiving surface by 0.8 mm.

In order to prevent deterioration in image quality, which would otherwise be induced by temperature variations, the following means is employed in the present invention.

Homogeneous material having a high degree of plane smoothness and a low coefficient of thermal expansion is desirable as material for the frame of the rod lens array. Soda lime glass, which is a low-cost material, has a coefficient of thermal expansion of about $8.8 \times 10^{-6}$ $deg^{-1}$ and matches the above-described requirements.

A conceivable measure to prevent variations in relative position between the light-emitting array chip and the lens element stemming from changes in temperature is to use material having a low coefficient of thermal expansion for the substrate and the rod lens array. Finding another material is difficult, in view of ease of working and costs. For this reason, there is employed a method of allowing given thermal expansion and taking the thermal expansion into account.

In connection with the structure of the related-art optical write head, variations in the position of the light-emitting devices due to temperature changes depend on the temperature characteristic of a substrate on which light-emitting devices are to be bonded, in the same manner as mentioned previously. For this reason, there must be selected a material whose coefficient of thermal expansion is close to that of a rod lens array having a glass frame; that is, a thermal expansion coefficient of $8.8 \times 10^{-6}$ deg$^{-1}$. As an insulating material for a substrate set forth, there can be employed ceramic, such as alumina, as provided in Table 1. However, a ceramic circuit board encounters difficult in stacking patterns on the board, thus resulting in an increase in the area of the board. Further, such an insulating material is comparatively expensive.

For this reason, the present invention provides an optical write head for solving these problems. FIG. 8 is a cross-sectional view showing the present invention of the optical write head according to the present invention. In an FPC substrate 257, copper foil wiring patterns 261 and 262 are laid on the surface of a resin layer 258 formed from high-temperature-resistant resin such as polyimide. The FPC substrate 257 is bonded to a metal block 251 formed from metallic material, by means of a thermosetting adhesive 265. Light-emitting device array chips 250 are arranged and mounted in predetermined positions on the FPC substrate 257 bonded onto the metal block 251. The light-emitting device array chips 250 are arranged by means of a die bonder and fixed by means of a conductive adhesive. Before assembly of the FPC substrate 257 into an optical write head, the light-emitting array chips 250 and the FPC substrate 257 are electrically connected together through use of Au lines 263, by means of wire bonding.

As shown in FIG. 5, the metal block 251 is secured onto a support member 256 having rigidity, by means such as a bolt 253 The rod lens array 254 is bonded to a predetermined position on the support member 256. The drive circuit board 255 is also secured to the support member 256. The other end of the FPC substrate 257 is connected to a connector 264 provided on the drive circuit board 255.

Since the FPC substrate 257 is formed from resin such as polyimide, the resin by nature possesses a very high coefficient of thermal expansion, as provided in Table 1. However, the resin is a thin and flexible material. The extent to which resin is to thermally expand is substantially determined by the extent to which the material bonded to the metal block 251 is to thermally expand. Accordingly, the only requirement is that a material which is to thermally expand to the same extent as the rod lens array 254 be selected as material for the metal block 251.

When 45% nickel steel having a thermal expansion coefficient of $8.1 \times 10^{-6}$ deg$^{-1}$ is employed as material for the metal block 251, the extent to which the light-emitting device array chips 250 are to thermally expand is $8.1 \times 10^{-6}$ deg$^{-1} \times 40$ deg$\times 320$ mm=0.10 mm for a size slightly larger than A3. The extent to which the optical write head according to the present invention is to thermally expand can be made 0.73 mm smaller than that to which a related-art optical write head formed from a glass epoxy substrate is to thermally expand. The percentage of change in the width of an image due to a temperature change (e.g., a change from 25° C. to 65° C.) can be reduced from 0.26% to 0.03%.

Moreover, as shown in Table 1, Ti has a thermal expansion coefficient of about $7 \times 10^{-6}$ deg$^{-1}$ and this material can also be used for the metal block 251.

The amount of light is usually corrected while the optical write head is separated from a printer. A light-receiving element is situated at a position where an image is to be formed, and the distribution of light quantity is determined. In order to make the distribution of light quantity flat, the amount of light is controlled by means of changing a per-chip current to be supplied to the light-emitting devices. At this time, there is a necessity of setting ambient temperature to the temperature of the surroundings of the optical write head arising during operation of the printer, thereby enabling effective correction of the distribution of light quantity during actual operation of the printer. However, the present invention obviates a necessity of temperature setting. Even if changes arise in the temperature of the optical write head during operation, correction of light quantity remains effective.

Since the glass epoxy substrate is material which is less likely to conduct heat (having a thermal conductivity of 0.38 W/m●k), the amount of heat liberated from the optical write head is low, and hence a rise in the temperature of the light-emitting array chips becomes greater. The amount of light emitted by a GaAs-based light-emitting device is known to drop about 0.5% as the temperature of the light-emitting device chip rises by 1° C. Hence, a rise in the temperature of the light-emitting array chip, accounts for a drop in the amount of light, with the result that a print speed is decreased. Further, if the substrate dissipates less heat than light-emitting array chip, a difference in the temperature distribution of the light-emitting device array chips 250 in its lengthwise direction is increased, thus resulting in an increase in unevenness in the amount of light in the sub-scanning direction.

As shown in FIG. 8, in the structure of the optical write head according to the present invention, only the resin (polyimide) layer 258 of 25 $\mu$m thickness and the copper foil 262 of 18 $\mu$m are interposed between the light-emitting array chips 250 and the metal block 251. The heat developing in the light-emitting device array chips 250 is readily propagated to the metal block 251 serving as a heat sink. Hence, a difference in the heat distribution of the light-emitting device array chips 250 and a rise in the temperatures of all the light-emitting device array chips 250 can be reduced. Preferably, the FPC substrate 257 can be made as thin as possible.

According to thermal analysis data, a difference in temperature distribution of a glass epoxy substrate structure is estimated as 0.041° C., and that or a flexible printed wiring film or sheet structure of the same geometry is estimated as 0.08° C. Use of the flexible printed wiring film or sheet results in a temperature rise being dropped from 16° C. to 6° C.

The above description has explained the means for preventing changes in the temperature of the optical write head during use. However, temperature variations arise even in a process of assembling an optical write head. As mentioned above, the light-emitting device array chips 250 are bonded to the copper foil 262 laid on the FPC substrate 257, by use of a conductive adhesive. Curing a conductive adhesive usually requires a heating operation at a temperature of about 150° C. Hence, the light-emitting device array chips 250 and the metal block 251 are bonded at this curing temperature while they are in an expanded state. If a difference exists in thermal expansion coefficient between the light-emitting device array chips 250 and the metal block 251, stress arises when they are cooled to room temperature. Such stress induces distortion in the light-emitting device array chips 250 or the FPC substrate 257. Cracking may arise in the light-emitting device array chips 250, or warpage may arise in the FPC substrate 257. Consequently, even when the light-emitting device array chips 250 are positioned correctly through use of a die bonder, there may arise a case where the chips deviate from the location where they have been positioned after bonding.

GaAs has a coefficient of thermal expansion of about $6 \times 10^{-6}$ deg$^{-1}$. In a case where the light-emitting device array chips 250 are formed from GaAs-based semiconductor, 42% nickel steel having a thermal expansion coefficient of $8.1 \times 10^{-6}$ deg$^{-1}$ and Ti having a thermal expansion coefficient of about $7 \times 10^{-6}$ deg$^{-1}$, both having been described previously, are substantially equal in coefficient of thermal expansion to GaAs, and either can be used as material suitable for this case.

A related-art LED array can be applied to a light-emitting device array to be used in the optical write head according to the present invention. Use of a self-scan-type light-emitting device array is more preferable. The reason for this is that the self-scan-type light-emitting device array obviates a necessity of interconnecting a light-emitting device and a driver IC in a one-to-one relationship. The self-scan-type light-emitting device array is suitable for a case where a substrate having a light-emitting device array mounted thereon is separated from a substrate having driver ICs mounted thereon.

Figure 12:
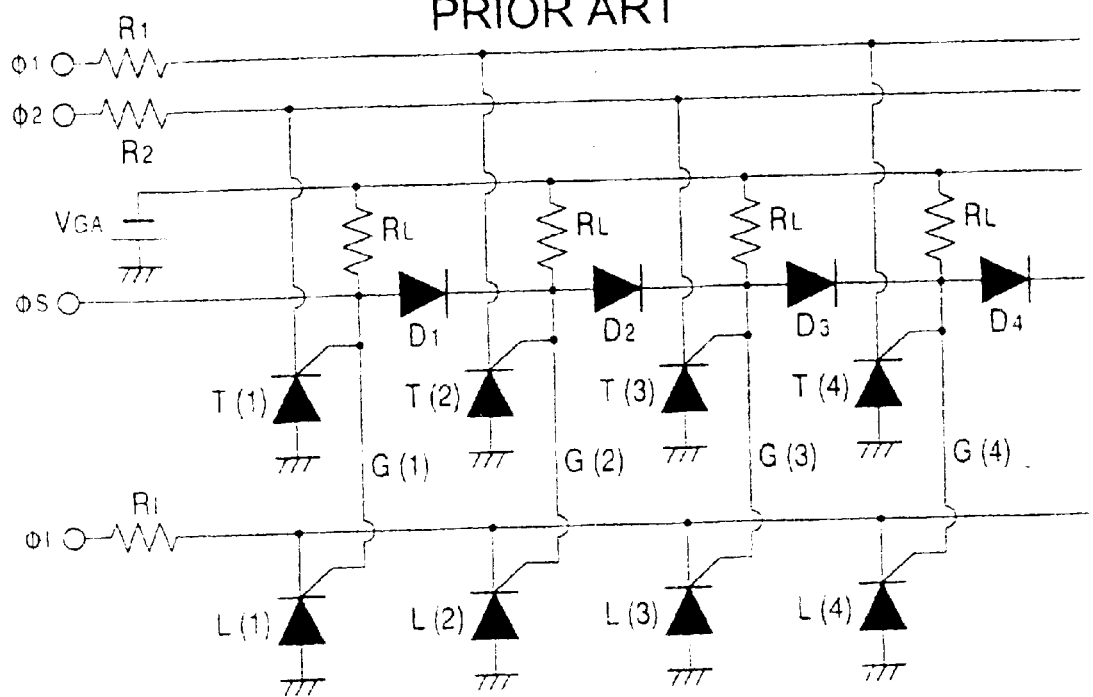
FIG. 12 is an equivalent circuit diagram showing a self-scan-type light-emitting device array in a related art.

FIG. 12 shows an equivalent circuit diagram of the self-scan-type light-emitting array (as described in Japanese Patent Application Laid-Open No. 263668/1990). The light-emitting device is formed from an array consisting of transfer thyristor devices T(1), T(2), . . . and light-emitting thyristor devices L(1), L(2), . . . The drawing shows only a portion of the array. The transfer thyristor devices T(1), T(2), . . . are interconnected by means of diodes D1, D2, . . . $V_{GA}$ denotes a power line (usually assuming −5V) which is connected to a gate electrode or each of the thyristor devices T and L. A start pulse signal $\Phi_s$ is applied to the gate electrode of the thyristor device T(1). Clock pulse signals $\Phi_1$ and $\Phi_2$ are applied to the cathode electrodes of alternating thyristor devices T. The gate electrodes of the transfer thyristor devices T(1), T(2), . . . and the corresponding gate electrodes of the light-emitting thyristor devices are interconnected by means of wires G(1), G(2). A write signal $\Phi_r$ is applied also to the cathode electrodes of the light-emitting thyristor devices L.

In the above-described circuit configuration, the thyristor devices T(1), T(2), . . . are sequentially turned on by means of the two clock pulse signals $\Phi_1$ and $\Phi_2$. In association with such turning-on action, the light-emitting thyristors L(1), L(2), . . . enter a state in which they can be turned on sequentially. If any one of light-emitting thyristor devices is turned on or enters a luminous state, the luminous intensity of the light-emitting thyristor device is determined by the amount of electric current to flow as a write signal $\Phi_r$; that is, resistance $R_r$. An image can be written at arbitrary intensity. As can be seen from FIG. 12, the self-scan-type light-emitting array of such a configuration requires interconnection of only a total of six terminals per chip; that is, two power terminals and four signal terminals. Thus, the number of connections does not depend on the number of light-emitting devices mounted on one chip. Hence, in a case where 128 light-emitting devices, for example, are mounted per chip, the number of wires to be connected to a drive IC per chip can be reduced to one-twentieth those required for a related-art LED array chip.

By replacing a related-art LED array chip with the self-scan-type light-emitting array chip, a driver IC can be readily mounted on a substrate differing from that having light-emitting devices mounted thereon (see Japanese Patent Application Laid-Open No. 187981/1997). Such a construction can be said to be a method for reducing the width of the substrates and miniaturizing an optical write head more effectively than a method using the related-art LED array chip.

Table 1

TABLE 1

| MATERIAL | THERMAL CONDUCTIVITY (W/m ° K.) | COEFFICIENT OF THERMAL EXPANSION ($10^{-6}$ deg$^{-1}$) |
|---|---|---|
| GLASS | 0.76 | 8.8 |
| Cu | 339 | 16.5 |
| Ti | 27 | 7.0 |
| Ni ALLOY | 13.4 | 8.1 |
| POLYIMIDE | 0.1 | 170 |
| FRP | — | 6 THROUGH 16 |
| GaAs | — | 6.0 |

According to the present embodiment, there can be prevented a misalignment between the optical axis of an optical write bead and the optical axis of a light-emitting device, which would otherwise be caused by temperature variations arising during assembly or operation of the optical write head. Accordingly, occurrence of inconsistencies in the density of an image can be prevented. There is also obviated a necessity for managing the temperature of the optical write head when the distribution of light quantity is measured for correcting light quantity. Further, dissipation of heat from the light-emitting devices is improved. Hence, variations in the distribution of light quantity of light-emitting array chips due to temperature variations can be reduced. There can be prevented occurrence of inconsistencies in density of an image, which would otherwise be caused by variations in the distribution of light quantity.

What is claimed is:

1. An optical write bead comprising a substrate, and a plurality of light-emitting device array chips arranged on the substrate in a straight line or in a staggered layout so as to oppose a rod lens array, each of the light-emitting device array chips having a light-emitting device array, wherein the rod lens array, a substrate support member for supporting the substrate, and a driver circuit board are each secured directly to a support member.

2. The optical write head according to claim 1, wherein the support member and the substrate support member are formed from metallic material.

3. The optical write head according to claim 1, wherein at least one frame of the rod lens array to be bonded to said support member is a glass plate.

4. The optical write head according to claim 1, wherein a plurality of adhesive injection holes are formed in a surface of the support member with which the rod lens array is to be brought into contact, the holes being arranged along a longitudinal direction of the rod lens array and being formed so as to penetrate through the support member to a reverse side thereof.

5. The optical write head according to claim 1, wherein at least one slit of V-shaped cross section for injecting an adhesive is formed in a portion of a surface of the support member to be brought into contact with the rod lens array, so as to extend in the longitudinal direction of the rod lens array, and a plurality of adhesive injection holes are formed in the at least one slit so as to penetrate through the support member to a reverse side thereof.

6. The optical write head according to claim 1, wherein at least two positioning pins are provided at predetermined positions on the substrate support member.

7. The optical write head according to claim 1, wherein at least two rotatable eccentric pins penetrating through the support member are provided so as to come into contact with the substrate support member.

8. A method of adjusting an optical write head comprising a substrate, and a plurality of light-emitting device array chips arranged on the substrate in a straight line or in a staggered layout so as to oppose a rod lens array, each of the light-emitting array device chips having a light-emitting device array, wherein the rod lens array, a substrate support member for supporting the substrate, and a driver circuit board are each secured directly to a support member, wherein at least two rotatable eccentric pins penetrating through the support member are provided so as to come into contact with the substrate support member, the method comprising the step of rotating the at least two eccentric pins to thereby move the substrate support member kept in contact with the eccentric pins and adjust the distance between a light-emission section of the light-emitting device array and a light-incident end face of the rod lens array.

9. A method of optically aligning elements of an optical write head comprising a substrate, and a plurality of light-emitting device array chips arranged on the substrate in a straight line or in a staggered layout so as to oppose a rod lens array, each of the light-emitting array device chips having a light-emitting device array, the method comprising the steps of securing the rod lens array by a plurality of adhesive injections, a substrate support member for supporting the substrate, and a driver circuit board to a support member, and die-bonding the light-emitting device array chips to the substrate to a predetermined location on the substrate support member while being positioned with respect to a reference plane of the substrate support member.

10. An optical write head comprising a substrate, and a plurality of light-emitting device array chips arranged on the substrate in a straight line or in a staggered layout so as to oppose a rod lens array, each of the light-emitting device array chips having a light-emitting device array, wherein the light-emitting device array chips are mounted directly on a flexible printed circuit sheet interposed between the substrate and the light-emitting device array chips.

11. The optical write head according to claim 10, wherein a reverse surface of a light-emitting device array chip mount section of the flexible printed circuit sheet is disposed in close contact with said substrate having rigidity.

12. The optical write head according to claim 11, wherein reference position marks for specifying respective positions at which the light-emitting array chips are to be arranged are provided on a surface of the substrate which has rigidity and are disposed in close contact with the flexible printed circuit sheet.

13. The optical write head according to claim 10, wherein the flexible printed circuit sheet is of multilayer type and interposed between the resin layer and the copper foil.

14. The optical write head according to claim 10, wherein the flexible printed circuit sheet has a thickness of 30 to 50 μm.

15. The optical write head according to claim 10, wherein the light-emitting array is a self-scan-type light-emitting array.

16. A method of assembling an optical write head, comprising the steps of:
bonding a portion of a flexible printed circuit sheet to a member having rigidity;
arranging a plurality of light-emitting device array chips at a predetermined positions on the flexible printed circuit sheet in the form of a straight line or in a staggered layout and bonding the light-emitting device array chips directly to the flexible printed circuit sheet on a side of the flexible printed circuit sheet that is opposite the member having rigidity;
electrically connecting the light-emitting device array chips to predetermined wire bonding pads provided on the flexible printed circuit sheet by means of wire bonding; and
fixing the member having rigidity at a predetermined position on a support member having a rod lens array and a light-emitting device array drive circuit board mounted thereon beforehand with light emitting device array chips opposing said rod lens array.

17. An optical write head comprising a flexible circuit sheet remaining in close contact with a member having rigidity, and a plurality of light-emitting device array chips arranged on the flexible circuit sheet in a straight line or in a staggered layout so as to oppose a gradient index rod lens array, each of the light-emitting array chips having a light-emitting device array, wherein the member having rigidity is a metallic member substantially equal in coefficient of thermal expansion to the rod lens array.

18. The optical write head according to claim 17, wherein a frame of the rod lens array is formed from glass, and the metallic member is a nickel alloy or titanium.

19. The optical write head according to claim 17, wherein the light-emitting device array is a self-scan-type light-emitting device array.

20. An optical write head comprising a flexible circuit sheet remaining in close contact with a member having rigidity, and a plurality of light-emitting device array chips arranged on the flexible circuit sheet in a straight line or in a staggered layout so as to oppose a gradient index rod lens array, each of the light-emitting array chips having a light-emitting device array, wherein the member having rigidity is a metallic member substantially equal in coefficient of thermal expansion to the light-emitting device array chips.

21. The optical write head according to claim 20, wherein a frame of the rod lens array is formed from glass, and the metallic member is nickel alloy or titanium.

22. The optical write head according to claim 20, wherein the light-emitting device array is a self-scan-type light-emitting device array.

23. An optical write head comprising:
a support member having first and second reference planes;
a gradient index rod lens array having gradient index rod lenses arrayed in at least one row and a frame that supports the rod lenses and that is fixed to the first reference plane;
a substrate support member fixed to the second reference plane;
a flexible printed circuit substrate fixed to the substrate support member; and
a plurality of self-scanning, light-emitting device array chips that are provided to the flexible printed circuit substrate and that have light-emitting devices optically aligned with respect to the respective gradient index rod lenses.

24. The optical write head according to claim 23, wherein the first reference plane is flush with the second reference plane.

25. The optical write head according to claim 23, wherein the first reference plane is parallel to the second reference plane.

26. The optical write head according to claim 23, wherein each of the support member and the substrate support member is made of metal.

27. The optical write head according to claim 23, wherein the frame is made of glass.

28. The optical write head according to claim 23, wherein the light-emitting device array chips are fixed to the flexible printed circuit substrate after the flexible printed circuit substrate is fixed to the substrate support member.

29. The optical write head according to claim 28, wherein the substrate support member is substantially equal in coefficient of thermal expansion to the light-emitting array chips.

30. The optical write head according to claim 23, wherein the substrate support member is substantially equal in coefficient of thermal expansion to the gradient index rod lens array.

31. An optical printer comprising:

a photosensitive drum;

the optical write head constructed according to claim 23 and arranged around the photosensitive drum so that the gradient index rod lenses are confronted with the photosensitive drum;

an electrostatic charger arranged around the photosensitive drum;

a development unit arranged around the photosensitive drum;

a transfer unit arranged around the photosensitive drum; and a fixing unit arranged downstream of the transfer unit with respect to a paper feeding direction.

* * * * *